US010206301B2

(12) United States Patent
Nagerl et al.

(10) Patent No.: US 10,206,301 B2
(45) Date of Patent: Feb. 12, 2019

(54) METHOD OF FABRICATING ELECTROMAGNETIC META-MATERIALS

(71) Applicant: Lockheed Martin Corporation, Bethesda, MD (US)

(72) Inventors: Andy Nagerl, Owego, NY (US); John Watkins, Berkshire, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 551 days.

(21) Appl. No.: 14/322,453

(22) Filed: Jul. 2, 2014

(65) Prior Publication Data

US 2014/0313685 A1    Oct. 23, 2014

Related U.S. Application Data

(63) Continuation of application No. 13/403,328, filed on Feb. 23, 2012.

(51) Int. Cl.
| | |
|---|---|
| *H05K 1/02* | (2006.01) |
| *H05K 7/14* | (2006.01) |
| *B32B 3/12* | (2006.01) |
| *B32B 3/28* | (2006.01) |
| *H05K 9/00* | (2006.01) |

(52) U.S. Cl.
CPC ............... *H05K 7/14* (2013.01); *B32B 3/12* (2013.01); *B32B 3/28* (2013.01); *H05K 1/0236* (2013.01); *H05K 9/0086* (2013.01); *H05K 1/024* (2013.01); *Y10T 428/13* (2015.01); *Y10T 428/24149* (2015.01); *Y10T 428/24157* (2015.01)

(58) Field of Classification Search
None
See application file for complete search history.

(56) References Cited

U.S. PATENT DOCUMENTS

| | | | | |
|---|---|---|---|---|
| 3,616,141 | A | * | 10/1971 | Anderson ............ B31D 3/0207 156/197 |
| 5,125,992 | A | | 6/1992 | Hubbard et al. |
| 6,938,325 | B2 | | 6/2005 | Tanielian |
| 7,797,817 | B2 | | 9/2010 | Margomenos et al. |
| 2004/0151876 | A1 | | 8/2004 | Tanielian |
| 2011/0024160 | A1 | * | 2/2011 | Quan ..................... H05K 1/024 174/254 |
| 2012/0013514 | A1 | * | 1/2012 | Yang .................... H01Q 21/062 343/746 |

OTHER PUBLICATIONS

Definition of Terminal(electronics) from Wikipedia. (Year: 2018).*

(Continued)

*Primary Examiner* — Barbara J Musser
(74) *Attorney, Agent, or Firm* — Wolf, Greenfield & Sacks, P.C.

(57) ABSTRACT

Apparatus including meta-materials and methods for making the apparatus are described. Circuit components, such as split ring resonators and/or spiral loops, may be formed on substrates to form the meta-materials. The meta-materials may be used in various types of apparatus. The methods of making the apparatus may include forming two and/or three-dimensional structures comprising the meta-materials.

15 Claims, 10 Drawing Sheets

(56) References Cited

OTHER PUBLICATIONS

Shelby, R.A.; Smith, D.R.; Schultz, S.; "Experimental Verification of a Negative Index of Refraction," Science, 2001, 292, p. 77-79.

Su, H.; Liu, X.; Li, D.; Chen, X.; Parini, C.G.; Kreouzis, T.; "Design and Analysis of Active Frequency Selective Surfaces with Organic Semiconductor" 21$^{st}$ International Symposium on Space Terahertz Technology, 2010, p. 360-363.

"Metamaterial," *Wikipedia,* pp. 1-15, http://en.wikipedia.org/wiki/Metamaterial, downloaded Feb. 28, 2012.

\* cited by examiner

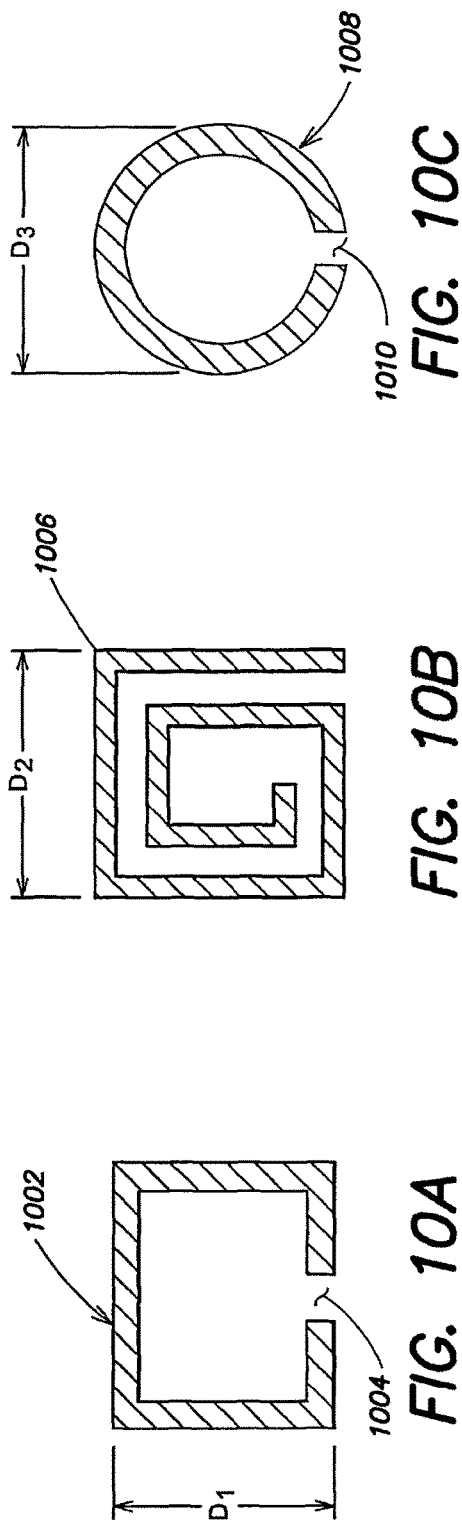

METHOD OF FABRICATING ELECTROMAGNETIC META-MATERIALS

CROSS REFERENCE TO RELATED APPLICATIONS

This application claims the benefit under 35 U.S.C. § 120 as a continuation of U.S. patent application Ser. No. 13/403,328 filed Feb. 23, 2012, abandoned after filing the present application, and entitled "Electromagnetic Meta-Materials," which is incorporated herein by reference in its entirety.

BACKGROUND

Field

The present application relates to electromagnetic meta-materials.

Related Art

Meta-materials are engineered materials that can exhibit a negative magnetic permeability. Magnetic permeability is often designated by "mu" (μ), and therefore meta-materials are sometimes referred to as mu negative (MNG, or μ negative) materials.

BRIEF SUMMARY

According to one aspect of the present application, a meta-material is provided. The meta-material comprises a plurality of corrugated substrates comprising a first corrugated substrate and a second corrugated substrate. The first corrugated substrate comprises a plurality of first peaks and a plurality of first troughs, and the second corrugated substrate comprises a plurality of second peaks and a plurality of second troughs. Each of the first and second corrugated substrates may have at least one circuit component formed thereon. The first peaks may be substantially aligned with the second peaks and the first troughs may be substantially aligned with the second troughs.

According to another aspect of the present application, a meta-material is provided, comprising a slab of a first material. The meta-material further comprises a plurality of substrate strips disposed within the first material and arranged in an array. A first substrate strip of the plurality of substrate strips may have a circuit component formed thereon.

According to another aspect of the present application, an apparatus is provided. The apparatus comprises a meta-material including a slab of a first material in which are embedded substrate strips including circuit components thereon. The apparatus may further comprise a container in which the slab is disposed. The first substrate strip passes at least partially through a first surface of the container.

According to another aspect of the present application, a meta-material is provided comprising a plurality of substrate strips. The plurality of substrate strips includes a first substrate strip and a second substrate strip. Each of the first and second substrate strips includes at least one circuit component formed thereon. The second substrate strip may be disposed at least partially within a slot of the first substrate strip.

BRIEF DESCRIPTION OF DRAWINGS

Various aspects and embodiments of the technology will be described with reference to the following figures. It should be appreciated that the figures are not necessarily drawn to scale. Items appearing in multiple figures are indicated by the same or similar reference number in all figures in which they appear.

FIGS. 10A-10E illustrates non-limiting examples of circuit components which may be used to form meta-materials according to various aspects of the present application.

DETAILED DESCRIPTION

Applicants describe herein electromagnetic meta-materials, methods for making such materials, and apparatus including such materials. According to various aspects, the electromagnetic meta-materials may include one or more substrates on which one or more circuit components may be formed, such as split ring resonator circuits. The substrates may take various forms and may be made of various materials. Furthermore, two or more substrates may be combined to form a two dimensional or three dimensional structure. In some such embodiments, a filler material may be disposed between substrates, for example to tune the electromagnetic behavior of the meta-material.

Some aspects of the present application provide methods for fabricating electromagnetic meta-materials of the types described herein. The methods may involve, in some non-limiting embodiments, forming circuit components on a substrate, and then positioning the substrates suitably relative to each other to form the meta-material. For example, split ring resonator circuits may be formed on one or more substrates, and then the substrates may be combined in any suitable manner to form a two-dimensional or three-dimensional electromagnetic meta-material.

Some aspects of the present application are directed to apparatus (or structures) which may be used in the fabrication of meta-materials of at least some of the types described herein. In some embodiments, the apparatus may facilitate formation of a meta-material in which substrates having circuit components formed thereon are embedded (or encased) within a filler material. The filler material may facilitate maintaining the substrates in a desired position relative to each other, and may be used, in some non-limiting embodiments, to tune the electromagnetic behavior of the meta-material.

The aspects described above, as well as additional aspects, are described further below. These aspects may be used individually, all together, or in any combination of two or more, as the technology is not limited in this respect, unless otherwise stated.

Figure 1:
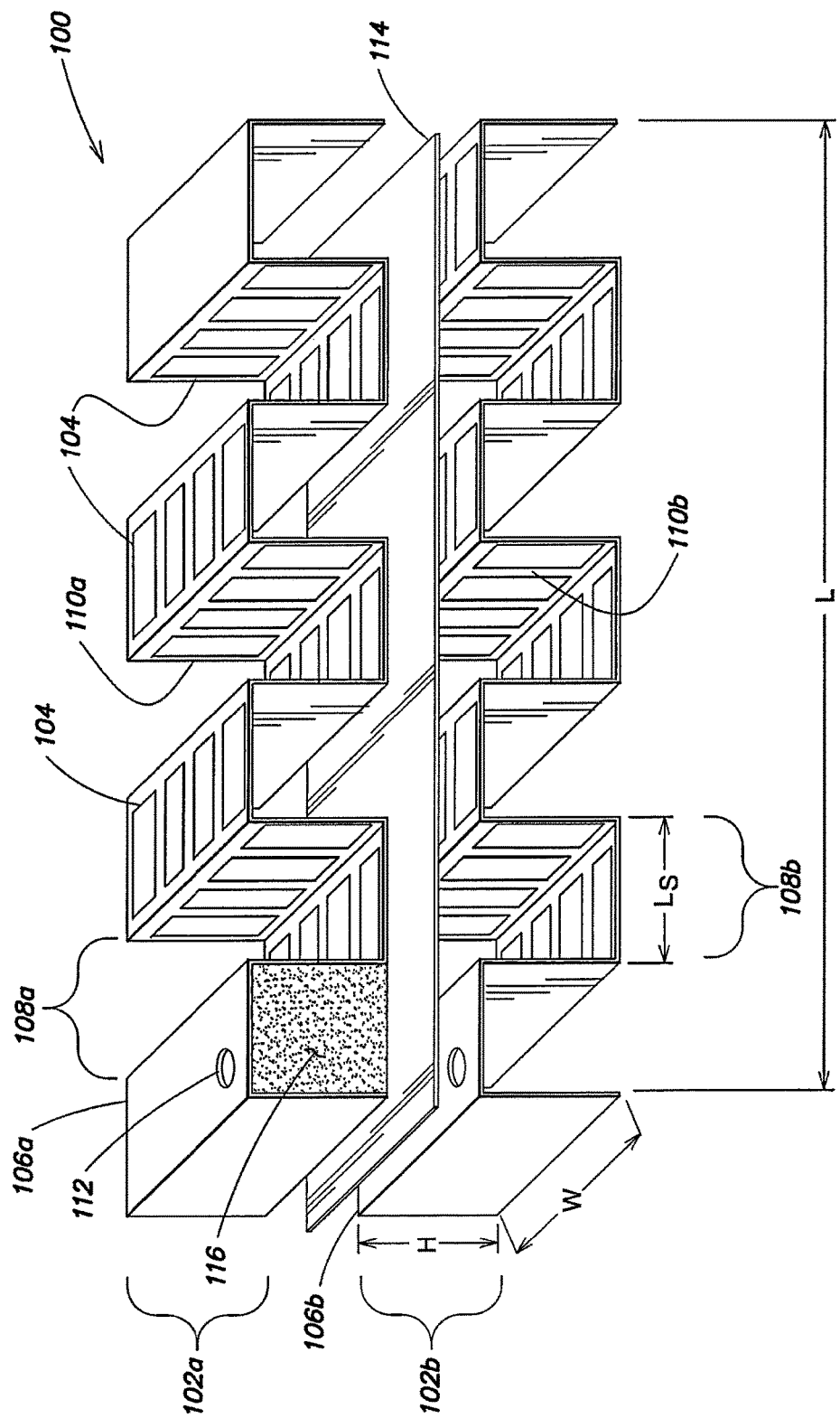
FIG. 1 illustrates a meta-material comprising corrugated substrates with circuit components formed thereon, according to a non-limiting embodiment.

According to a first non-limiting aspect of the present application, an electromagnetic meta-material may comprise two or more corrugated substrates, on which one or more circuit components may be formed. The corrugated substrates may be substantially aligned. For example, peaks of one of the corrugated substrates may substantially align with peaks of the other corrugated substrate(s). Similarly, troughs of one of these substrates may substantially align with troughs of the other substrate. A non-limiting example is illustrated in FIG. 1.

As shown, the electromagnetic meta-material 100 comprises multiple corrugated substrates 102a and 102b. For purposes of simplicity, only two corrugated substrates are illustrated. However, it should be appreciated that electromagnetic meta-materials according to the present aspect may, and in some scenarios will, include more than two corrugated substrates. For instance, tens, hundreds, thousands, or any suitable number of substrates may be used to form a meta-material of desired dimensions. As shown, each of the corrugated substrates 102a and 102b may include circuit components 104. In the non-limiting embodiment of FIG. 1, each of the corrugated substrates 102a and 102b includes four circuit components 104 on each corrugated segment, positioned across the width W.

The substrates 102a and 102b may be formed of any suitable material. For example, in one non-limiting embodiment, the substrates 102a and 102b are formed of printed circuit boards (PCBS). The material may, in some embodiments, be selected to provide a desired electromagnetic property (e.g., a desired dielectric constant). For instance, according to one non-limiting embodiment, the substrates 102a and 102b are formed of a low dielectric constant material. In some embodiments, the substrates 102a and 102b may be formed of a material that is substantially flexible, which may facilitate formation of the corrugated structures illustrated in FIG. 1. However, it should be appreciated that any suitable type of material may be used for the substrates 102a and 102b, and that the various aspects of the present application are not limited to using any particular type of material as a substrate material, unless otherwise stated.

The corrugated substrates 102a and 102b may have any suitable dimensions, including any suitable length L, any suitable width W, and any suitable height H. According to one non-limiting embodiment, the width W may take any suitable value between approximately 2 inches and 20 inches (e.g., approximately 5 inches, approximately 10 inches, etc.), between approximately 6 and 18 inches (e.g., 6 inches, 8 inches, 10 inches, 12 inches, etc.), between approximately 1 and 6 inches (e.g., 2 inches, 3 inches, etc.), less than approximately 3 inches, or may take any other suitable value. Similarly, the height H of corrugated substrates 102a and 102b may fall within a range from approximately 0.1 to 1 inch (e.g., 0.25 inches), between approximately 0.5 inches and 2 inches, less than 3 inches, or may take any other suitable values, as non-limiting examples. The length L may also assume any suitable value, for example ranging between 2 and 20 inches (e.g., 5 inches, 10 inches, 15 inches, or any other suitable value), as a non-limiting example. The length L may be greater than the width W. In some non-limiting embodiments, the length of the corrugated substrate may be substantially greater than the width of the substrates. In some such embodiments, the substrates may be referred to as corrugated ribbons or corrugated strips, though it should be appreciated that other terminology may also be used to refer such structures.

The corrugated substrates 102a and 102b may include any suitable number of corrugations, and therefore any suitable number of corrugated segments. The segments may have any suitable length $L_S$. For example, the length $L_S$ may fall within a range from approximately 0.1 inches to approximately 1 inch (e.g., ¼ inch), from approximately 0.5 inches to approximately 2 inches, less than 2 inches, less than 1 inch (e.g., ¼ inch, ½ inch, etc.), or may take any suitable value. Furthermore, not all segments need have the same length. For example, peak and trough segments may differ in length from each other. Alternatively, or in addition, the length of vertical segments (e.g., segments perpendicular to the adhesive layer 114, described further below) may differ in length from the length of peak segments and/or trough segments. Thus, the present aspect is not limited to substrates having any particular number or dimensions of corrugated segments. Therefore, it should be appreciated that the number of corrugations illustrated in FIG. 1 is non-limiting, as other numbers are possible.

As mentioned, the circuit components 104 may represent any suitable circuit component, or circuit. Also, as will be appreciated further from the non-limiting examples illustrated in FIGS. 3, 5, and 10A-10E, it should be appreciated that the components need not be connected within an electric circuit. Rather, as will be described, according to some non-limiting embodiments the circuit components may comprise conductive structures whose terminals are not directly connected to any other circuit components. According to a non-limiting embodiment, circuit components 104 represent split ring resonators. According to another non-limiting embodiment, the circuit components 104 may be spiral loops (e.g., conductive traces formed in a spiral). In both such embodiments, the terminals of the conductive structures need not be connected to any other circuit components. However, alternative circuit components or circuits may be implemented.

In those embodiments in which a split ring resonator or a spiral loop is formed on a corrugated substrate, the split ring resonator or spiral loop may have any suitable designs. For example, the split ring resonator or spiral loop may have any suitable dimensions, any suitable shapes and may be formed of any suitable material and in any suitable manner. Non-limiting examples of suitable circuit components 104 are illustrated in FIGS. 10A-10E.

In the non-limiting example of FIG. 10A, a split ring resonator 1002 is illustrated. As shown, the split ring resonator 1002 may include a substantially square trace (e.g., a copper trace, a copper wire, or any other suitable conductive structure), with a single split 1004 between two ends of the trace. The split ring resonator may have any suitable dimension $D_1$.

FIG. 10B illustrates an alternative circuit component design, showing a spiral loop 1006. The spiral loop may have any suitable diameter $D_2$ and be formed of any suitable material (e.g., a copper trace or wire, aluminum, are any other suitable material).

A further non-limiting embodiment is illustrated in FIG. 10C, showing a substantially circular loop 1008 having a split 1010 between two end. The loop 1008 may have any suitable diameter $D_3$ and be formed of any suitable material.

FIG. 10D illustrates a further non-limiting embodiment, illustrating a spiral loop 1012 with a diameter D4.

In some embodiments, the circuit component may include multiple disconnected loops or rings. For example, FIG. 10E illustrates a non-limiting example in which two substantially square rings 1014a and 1014b are shown. The outer ring 1014b may have any suitable length $D_5$. Respective slits 1016a and 1016b may be formed in each loop, as shown, and the respective slits may be offset from each other. Other configurations are also possible.

In any of FIGS. 10A-10E, the illustrated structures may be formed of any suitable material (e.g., any suitable conducting material, such as copper, aluminum or any other suitable material).

Also, any suitable values for the dimensions of the structures in FIGS. 10A-10E may be used. In some embodiments, the dimensions of the illustrated structures may be chosen to provide desired electromagnetic behavior. For example, the dimensions may control a resonance frequency of the illustrated structures, and thus may be selected to provide a desired resonance frequency. As a non-limiting example, the dimension $D_1$ may control the resonance frequency of the loop 1002 in FIG. 10A. Thus, the value of $D_1$ may be selected such that the loop 1002 has a desired resonance frequency. However, not all embodiments are limited in this respect.

As non-limiting examples, the values of D1-D5 may be between approximately 0.1 inches and approximately 2 inches (e.g., ¼ inch, ½ inch, ¾ inch, etc.), between approximately one inch and four inches (e.g., two inches, three inches, etc.), may be between approximately one inch and two inches, may be less than approximately four inches, less than approximately two inches (e.g., 0.25 inches, 0.5 inches, one inch, etc.), or may have any other suitable values.

Referring again to FIG. 1, it should be appreciated that any number of circuit components 104 may be included, and that substrates 102a and 102b need not include an identical number of circuit components. Furthermore, each segment of the corrugated substrates 102a and 102b need not include the same number of circuit components, or any circuit components at all. For example, according to an alternative embodiment to that illustrated in FIG. 1, circuit components may only be included on the peak segments 106a and 106b of the corrugated substrates. According to an alternative embodiment, circuit components 104 may only be included on the trough segments 108a and 108b of the corrugated substrates. Alternatively, circuit components may only be included on the vertical wall segments 110a and 110b of the substrates 102a and 102b. Any combination of the segments of substrates 102a and 102b may include circuit components formed thereon in any suitable manner (as discussed further below).

As also illustrated in FIG. 1, in some non-limiting embodiments of the present aspect, the corrugated substrates 102a and 102b may be substantially aligned with each other. For example, the substrates 102a and 102b may be substantially aligned such that peak segments of the two substrates substantially align with each other and trough segments of the two substrates substantially align with each other. For instance, as illustrated in FIG. 1, peak segment 106a of corrugated substrate 102a substantially aligns with peak segment 106b of corrugated substrate 102b. Similarly, trough segment 108a of corrugated substrate 102a substantially aligns with trough segment 108b of corrugated substrate 102b. Moreover, wall segment 110a of corrugated substrate 102a substantially aligns with wall segment 110b of corrugated substrate 102b. The illustrated alignment is one non-limiting example of suitable alignment, as other alignment configurations may also be implemented.

Figure 2:
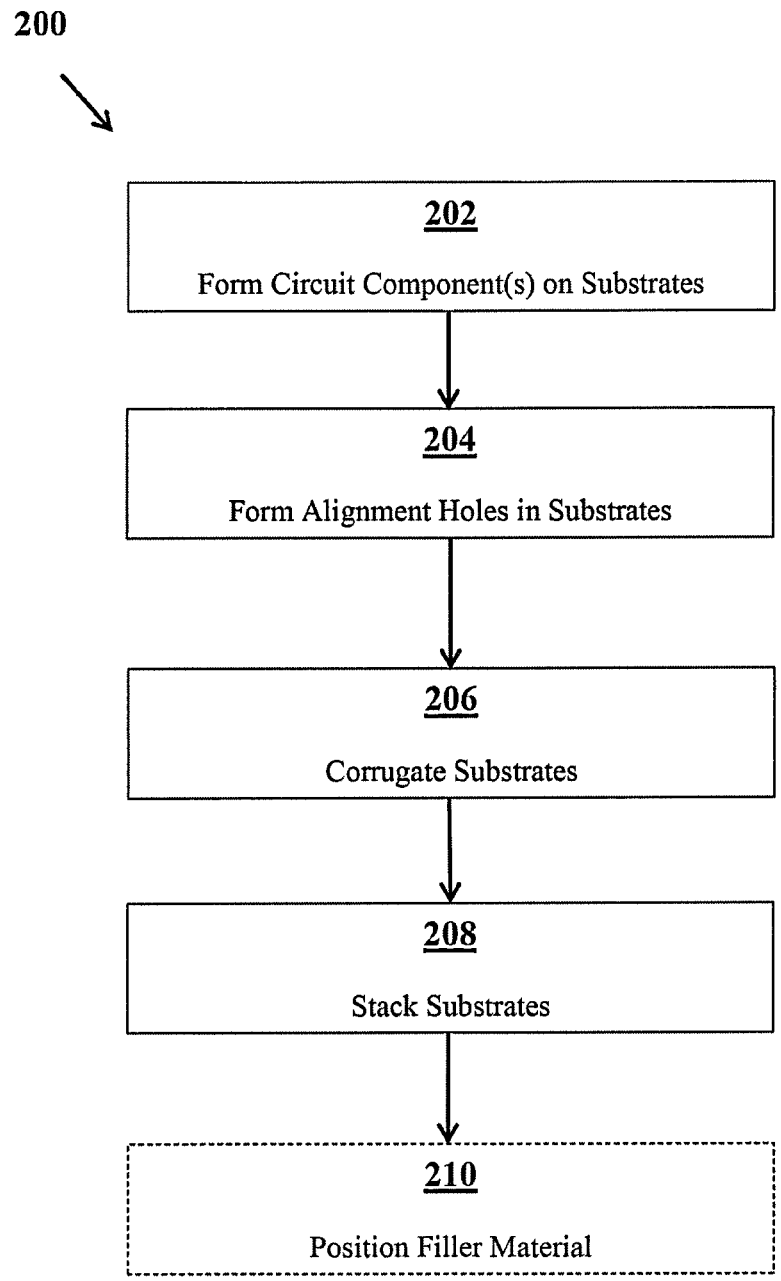
FIG. 2 is a flowchart illustrating a non-limiting process flow for making a meta-material of the type shown in FIG. 1.

As will be described further below with respect to FIG. 2, alignment of the corrugated substrates 102a and 102b may be facilitated by alignment features on one or more the substrates. For example, alignment holes 112 may be included to facilitate alignment of the substrates.

The electromagnetic meta-material of FIG. 1 may, optionally, further include a structure for maintaining the substrates in a desired alignment or configuration with respect to each other. For example, an optional adhesive layer 114 may be included. The optional adhesive layer 114 may be included to facilitate maintaining the fixed alignment between the corrugated substrates 102a and 102b. For example, each of corrugated substrates 102a and 102b may be fixedly adhered to a respective surface of the adhesive layer 114. In this manner, positioning of the corrugated substrates with respect to each other may be maintained. The shape of the corrugated substrates may also be maintained at least in part by the adhesive layer.

In those embodiments in which an adhesive layer 114 is included, the adhesive layer may be formed of any suitable material. For example, the adhesive layer 114 may comprise polyamide, a liquid crystal polymer, a plastic, or any other suitable material. In some embodiments, the adhesive layer may be formed of a material providing a desired electromagnetic property, such as a desired dielectric constant. For example, a material of low dielectric constant may be used as the adhesive layer 114. Thus, it should be appreciated that in those embodiments in which an adhesive layer is included, the adhesive layer is not limited to being formed of any particular material.

In some embodiments, an optional filler material may be included in the meta-material 100. The filler may be included to provide desired electromagnetic behavior (e.g., to tune the meta-material), may be provided to support the substrates (e.g., to maintain their shape), or may be provided for any other reason. As a non-limiting example, optional filler material 116 may be disposed between at least part of the corrugated substrate 102a and part of the corrugated substrate 102b. As illustrated, in this non-limiting example, the optional filler material may be disposed under a peak segment 106a of corrugated substrate 102a, for example between the corrugated substrate 102a and the adhesive layer 114. The filler material may be included for any suitable reason, for example to tune the frequency operation of the electromagnetic meta-material, to provide support for the corrugated substrate 102a, or for any other suitable reason.

The optional filler material may be any suitable material for providing the desired function (e.g., a supporting function, a frequency tuning function, etc.). According to some embodiments, the filler material 116 may be formed of a low dielectric constant material. The material may be chosen to have a dielectric constant which may be used to tune the frequency behavior of the electromagnetic meta-material (e.g., to tune the resonance frequency of the meta-material, or otherwise). The filler material may be foam (e.g., syntactic foam) in some non-limiting embodiments. According to some embodiments, the filler material 116 may have a dielectric constant that varies with position. For example, the filler material 116 may have a graded dielectric constant.

It should be appreciated that the structure illustrated in FIG. 1 may represent only part of a meta-material. For example, the illustrated structure may be repeated in the direction of H (e.g., additional substrates may be disposed above and/or below substrates 102a and 102b), L (e.g., additional substrates may be disposed to the right and/or left of substrates 102a and 102b), and/or W (e.g., additional substrates may be disposed in front of and/or behind the substrates 102a and 102b). Other orientations are also possible.

According to an aspect of the present application, a method of fabricating an electromagnetic meta-material comprising two or more corrugated substrates having circuit components formed thereon, such as the meta-material 100 of FIG. 1, is provided. FIG. 2 illustrates a non-limiting example of such a process.

As shown, the method 200 may begin at step 202 by forming circuit components on the substrates (e.g., split ring resonators, spiral loop structure, or other suitable circuit components). In some non-limiting embodiments, the circuit components may be formed by printing them on a substrate (e.g., with an inkjet printer or other suitable printing device), though not all embodiments are limited in this manner. Other manners of forming circuit components may be used. For example, non-limiting alternatives include depositing and etching electrical traces, fastening a circuit chip (e.g., a flexible circuit or any other type of circuit) to the substrate, or any other suitable manner. In those non-limiting embodiments in which the circuit components are printed, the printing may be performed using any suitable technique, such as laser inkjet printing, photolithographic printing, or any other suitable technique.

In step 204, alignment holes (e.g., alignment holes 112 in FIG. 1) may be formed in the substrates. Any suitable technique may be used for forming the alignment holes, such as etching, drilling, using a punch, or any other suitable technique.

As mentioned previously, alignment holes represent a non-limiting example of an alignment feature which may be used to facilitate alignment of the substrates. If features other than holes are used for alignment, such features may be formed at step 204.

While step 204 is illustrated as occurring after step 202, it should be appreciated that step 204 may alternatively be performed prior to printing of the circuit components on the substrates.

In step 206, the substrates may be creased or corrugated to assume the shapes illustrated in FIG. 1. The creasing or corrugation may be performed in any suitable manner.

In step 208, the corrugated substrates may be stacked in any suitable manner to form an electromagnetic meta-material of any desired size and shape. For example, as illustrated in FIG. 1, one or more corrugated substrates may be stacked upon one or more different corrugated substrates. If an optional adhesive layer is to be used (e.g., optional adhesive layer 114 of FIG. 1), it may be provided at this stage of the method 200. For example, step 208 may comprise adhering one or more substrates to an adhesive layer in a desired stacking relationship.

In step 210, filler material is optionally provided at suitable locations, for example as illustrated in FIG. 1 in terms of optional filler material 116. The optional nature of step 210 is indicated by the dashed lining in FIG. 2. Again, the filler material may optionally be a foam material (e.g., syntactic foam), or any other suitable material. If filler material is not inserted, the space between corrugated substrate 102a and 102b may simply be an air gap.

According to another non-limiting aspect of the present application, an electromagnetic meta-material comprises a slab of a first material in which are disposed distinct substrates on which one or more circuit components are formed. The substrates may be disposed within the slab of material (e.g., encased within the slab, embedded within the slab, or otherwise disposed at least partially within the slab) in an array of any suitable orientation. For example, substrates may be disposed at substantially 90° with respect to each other. A non-limiting example illustrated in FIG. 3.

Figure 3:
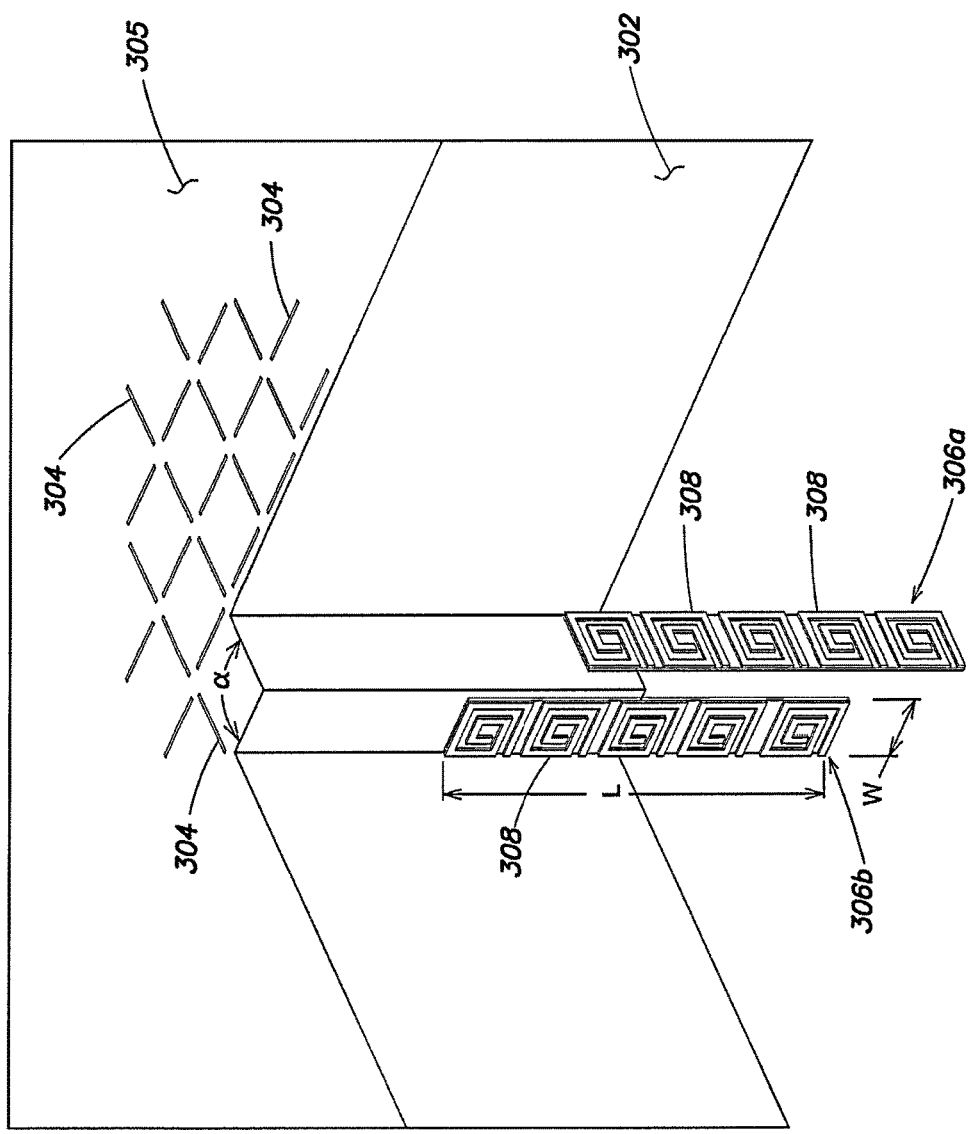
FIG. 3 illustrates a meta-material comprising a slab of material in which substrate strips are disposed, according to another non-limiting embodiment.

As shown, the electromagnetic meta-material 300 includes a slab 302 (FIG. 3 illustrates a cut-away view of the slab) of first material, in which slits 304 are formed. It should be appreciated that the terminology used herein is not limiting, and that various terms may be used to describe the illustrated structures. For example, slab 302 may alternatively be referred to as a "block" of material or a "body" of material, as non-limiting examples. Similarly, the slits 304 may alternatively be referred to as "slots," as a non-limiting example. Thus, the slab 302 may be referred to in some embodiments as a slotted dielectric slab. Also, it should be appreciated that the slits in some embodiments may more generally be openings, not necessarily having a slit structure.

As shown, a plurality of substrates may be disposed within respective slits 304 in the slab 302. In some non-limiting embodiments, the substrates may have a relatively small width W compared to the length L, and therefore may be referred to as substrate strips for purposes of explanation. The present embodiment assumes such a configuration, with FIG. 3 illustrating substrate strips 306a and 306b. The substrate strips may be disposed within slits oriented substantially at a right angle α with respect to each other. However, it should be appreciated that other angles of orientation may also be implemented.

The slab 302 may be formed of any suitable material. According to a non-limiting embodiment, the slab of material may comprise a syntactic foam. In some non-limiting embodiments, the slab of material may be formed of a material providing a desired dielectric constant. For example, given that the slab of material may effectively fill spaces between substrate strips 306a and 306b, the material may be used to tune the electromagnetic properties of the electromagnetic meta-material 300, e.g., the material of slab 302 may help control the resonance frequency of the meta-material 300. Accordingly, the material forming slab 302 may be selected to have any suitable dielectric constant.

The slits 304 may have any suitable dimensions. According to a non-limiting embodiment, slits 304 may be sufficiently sized to accommodate substrate strips 306a and 306b. For example, the slit 304 may be of substantial size to allow insertion of the strips into the slab 302, but may be suitably sized to maintain a sufficient pressure fit of the substrate strips, to maintain the substrate strips in a substantially fixed position. For example, the slits may have a dimension slightly less than the width W. In a non-limiting example, the substrate strips may have a width W of approximately 1 inch, such that each of the slits 304 may similarly have a width of approximately, but slightly less than, 1 inch. Alternative dimensions are possible.

Any suitable number of slits 304 may be provided in the slab 302 of material. According to a non-limiting embodiment, one slit per substrate strip may be provided. Alternative configurations are possible.

As will be described further below, the slits 304 may be formed in the slab 302 in any suitable manner. According to a non-limiting embodiment, the slab 302 may initially be formed as a substantially solid slab, without slits therein. Subsequently, slits may be formed in the slab, for instance using a cutting tool. Alternative manners of forming slits 304 are also possible.

The substrate strips 306a and 306b may be similar to corrugated substrates 102a and 102b, but without the corrugations (e.g., the substrate strips 306a and 306b may be substantially planar). The substrate strips 306a and 306b may be formed of any suitable material, may include any suitable dimensions, and may include any suitable type and number of circuit components formed thereon. For example, the substrate strips may have any of the features previously described with respect to substrates 102a and 102b. As a non-limiting example, each of substrate strips 306a and 306b includes five spiral loop resonators 308, as shown. However, alternative numbers and shapes are possible.

Figure 4:
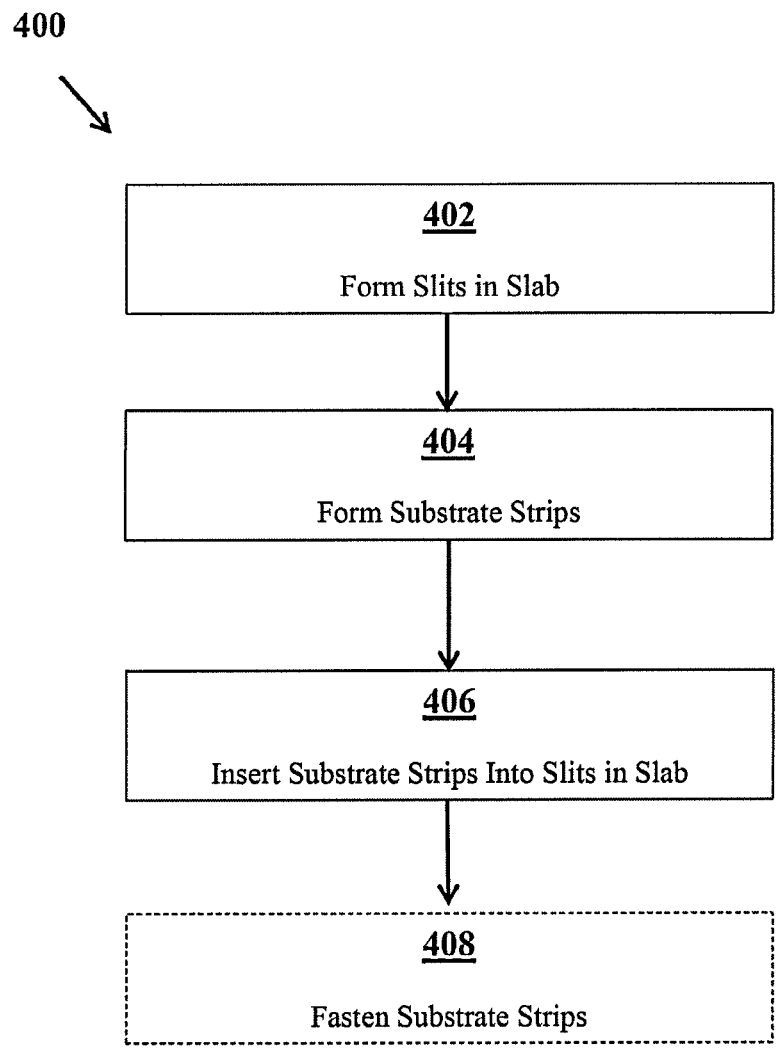
FIG. 4 is a flowchart illustrating a non-limiting process flow for making a meta-material of the type shown in FIG. 3.

FIG. 4 illustrates a method of fabricating an electromagnetic meta-material having a configuration like that illustrated in FIG. 3, in which one or more substrate strips of the type illustrated are embedded in a slab of material. As shown, the method 400 begins at step 402 by forming slits 304 (or slots) in a top surface 305 of the slab 302. In this non-limiting example, the slab 302 may be a foam material (e.g., a syntactic foam), or any other suitable material, e.g., a suitable dielectric material. The slits may be formed by machining them, broaching them, or using any other suitable technique. As an alternative to step 402, the slab may simply be molded in a manner resulting in the presence of slits.

At step 404, substrate strips 306a and 306b may be formed. This may be done in any suitable manner. For example, the substrate strips may be cut out of a larger sheet of substrate material, or may be formed in any other suitable manner. Similarly, the circuit components 308 may be formed on the substrate strips 306a and 306b in any suitable manner, for instance using any of the techniques previously described herein for forming circuit components on substrates.

At step 406, the substrate strips may be inserted into the slab 302 of material, in any suitable manner.

Optionally, at step 408, the substrate strips 306a and 306b may be fastened to the slab 302. For example, the substrate strips may be fastened to (or within) the slab using glue, a tack (e.g., tacks in both the bottom and top ends of the substrate strips), or any other suitable manner of fastening. Alternatively, as previously mentioned, these substrate strips may be substantially fixed relative to the slab due to a pressure fit of the strips within the slab.

The two dimensional configuration illustrated in FIG. 3 may be further extended in some non-limiting embodiments by placing substrate strips on the top and/or bottom surfaces of the slab 302. For example, the top surface 305 may have one or more substrate strips disposed thereon. The substrate strips 306a and 306b may then be suitably positioned to slide past any substrate strips disposed on the surface 305. Subsequently, a second slab of the configuration illustrated in FIG. 3 may be disposed upon the slab illustrated in FIG. 3, thus forming a three dimensional structure.

Figure 5:
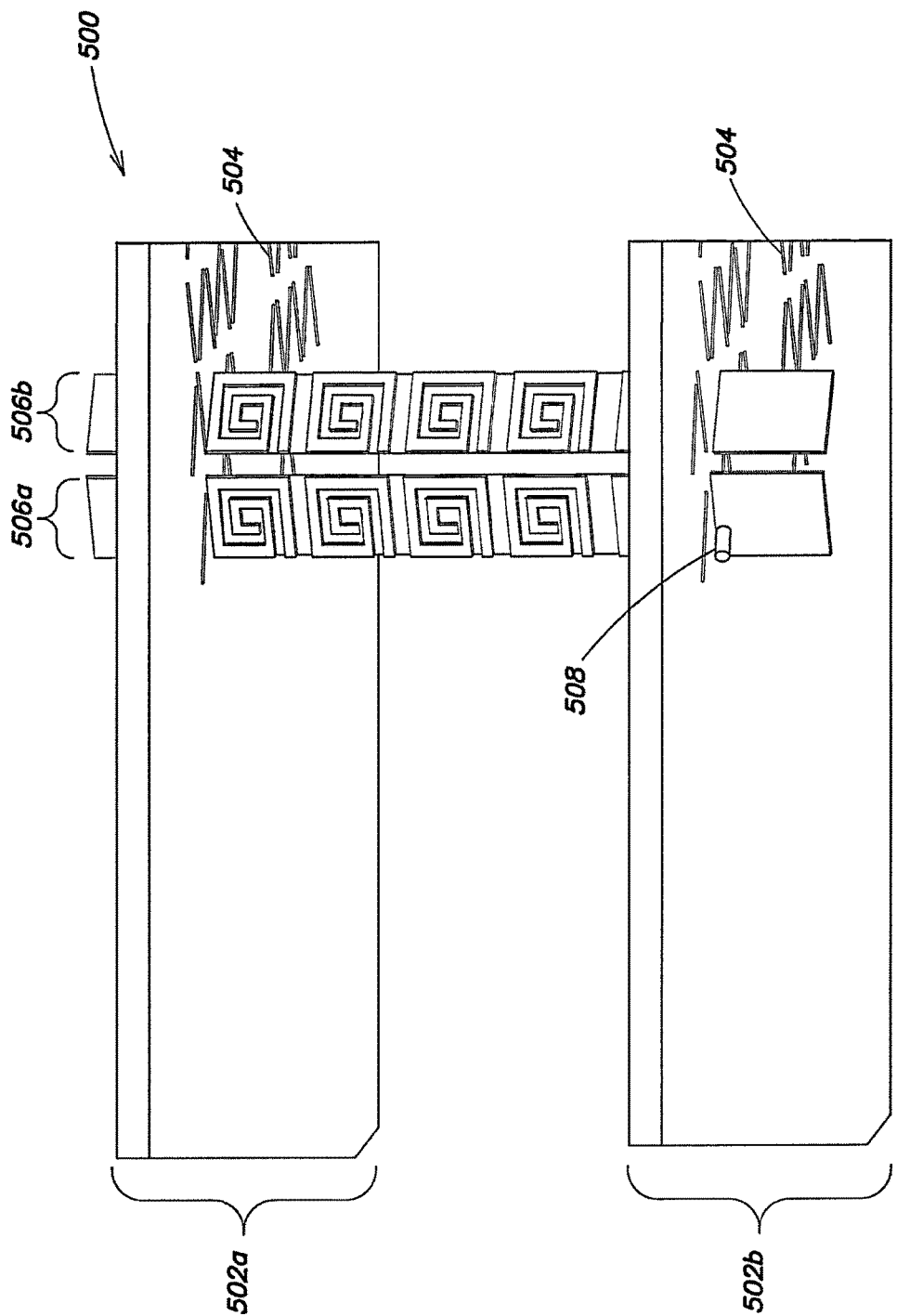
FIG. 5 illustrates an apparatus for making a meta-material, according to a non-limiting embodiment.

According to another non-limiting aspect of the present application, an apparatus and method of encapsulating substrate strips including circuit components (e.g., split ring resonators) within a slab of material are described. Briefly stated, the method may include fixing substrate strips in a desired orientation using one or more supports, and then filling a space enclosed by the supports with a material that becomes solid, thus encapsulating the substrate strips. A non-limiting example of a suitable apparatus is illustrated in FIG. 5.

As shown, the apparatus for encapsulating substrate strips of circuit components within a slab of material includes two supports, labeled as support sides 502a and 502b. Though not illustrated in FIG. 5 for purposes of simplicity, the apparatus 500 may further include further components to the supporting structure sufficient to form a structure that can be filled with a material. For example, further supports making up left and right ends and a bottom surface may be included, such that the combination of support sides 502a and 502b, together with any such left and right ends and bottom surface may substantially form a container or bucket-like structure having an open top. As illustrated, the support sides 502a and 502b may include multiple slits (also referred to herein as slots), openings, or other similar features therein. The slits 504 may accommodate substrate strips 506a and 506b. For example, the substrate strips 506a and 506b may be inserted into respective slits 504 in the support sides 502a and 502b.

As illustrated, the substrate strips 506a and 506b may be substantially the same as substrate strips 306a and 306b of FIG. 3. Thus, for purposes of simplicity, a detailed explanation of substrate strips 506a and 506b is not now given.

Any number of substrate strips may be inserted into slits in the support sides 502a and 502b, and in any suitable orientation. According to non-limiting embodiment, neighboring substrate strips may be oriented substantially at right angles with respect to each other. However, alternative configurations are possible.

Thus, as illustrated in FIG. 5, an apparatus for forming a slab of material having substrate strips encapsulated therein may be configured to define a volume in which the substrate strips are disposed. By filling the volume with an encapsulating material, such as syntactic foam, the resulting structure may include a slab of material in which are disposed the substrate strips 506a and 506b.

To facilitate fabrication and positioning of the substrate strips within the resulting slab of material, fasteners 508 may be inserted into the ends of the substrate strips 506a and 506b, for example to prevent sliding of the substrate strip relative to the support sides 502a and 502b of the apparatus prior to formation of the slab of material. The fasteners may be nails, tacks, pegs, or any other suitable fastening structures.

According to another aspect of the present application, a method of forming substrate strips having circuits thereon within a slab of material is described. For example, the method may implement the apparatus 500 of FIG. 5 and may be used to form a structure substantially similar to that illustrated in FIG. 3.

As shown, the method 600 begins at step 602 by forming substrate strips, which may be done in any of the manners previously described herein.

In step 604, the method continues with forming slits (or slots) in supports. For example, slits may be formed in support sides 502a and 502b. It should be appreciated that other types of openings (other than slits) may alternatively be formed, and that in some embodiments the openings need not go through the support. For example, an indentation may be formed in a wall of a support, and the substrate strip may be positioned to have an end within the indentation such that is remains fixed in place.

At step 606, substrate strips may be inserted into the supports via the slits (or other openings) formed in step 604. The substrate strips may thus assume a fixed position relative to the supports and with respect to each other.

In step 608, the substrate strips may be substantially fastened relative to the support sides 502a and 502b. For example, the substrate strips may be pinned using fasteners 508 or any other suitable fasteners. In this manner, substrate strips may be prevented from sliding into or out of the slits in the support sides 502a and 502b.

In step 610, the apparatus may be filled with a suitable material that will form into a slab. For example, "form in place foam" may be used, though any other suitable material may alternatively be used. In this manner, the substrate strips may be encased within the formed slab of material.

In step 612, the supports (e.g., support sides 502a and 502b) may be removed. Thus, at this stage, the remaining product may be a slab of material (e.g., a foam block formed of syntactic foam) including substrate strips having circuits thereon, with ends of the substrate strips projecting out of the slab of material.

Accordingly, in step 614, the ends of the substrate strips may be trimmed to remove excess amounts of the strips projecting out of the slab of material.

Figure 6:
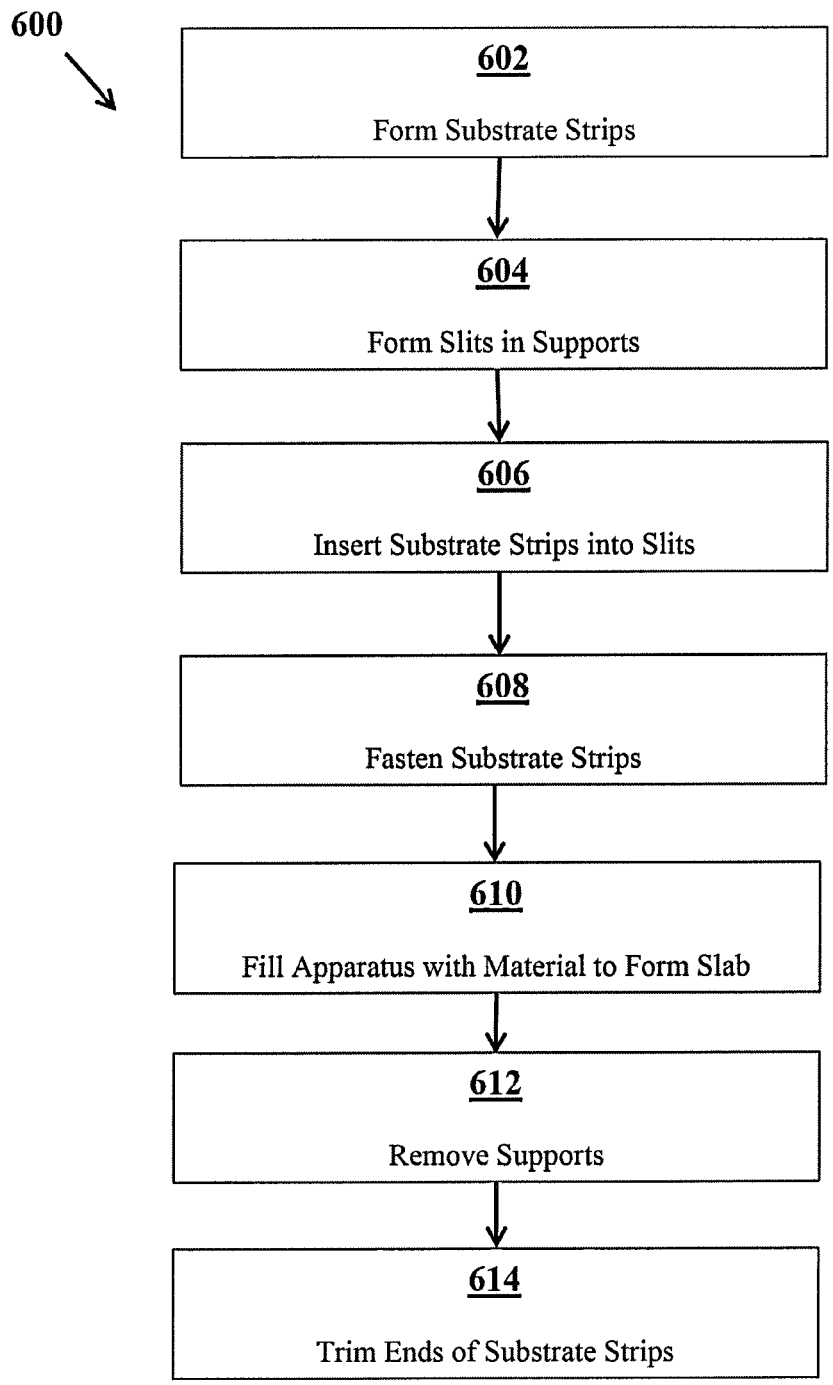
FIG. 6 is a flowchart illustrating a non-limiting process flow for making a meta-material using the apparatus of FIG. 5.

It should be appreciated that alternative manners to that of method 600 for forming such structures are possible, and that the methodology of FIG. 6 is provided as a non-limiting example.

According to another non-limiting aspect of the present application, an electromagnetic meta-material may be formed, at least in part, by interconnecting two or more substrates to form an array of circuit components. In some non-limiting embodiments, spaces between the substrates may be filled with a core material (or filler material), though in other embodiments any spaces between the substrates may be left as air gaps. A non-limiting example is illustrated in FIG. 7.

As shown, the electromagnetic meta-material 700 includes a plurality of substrates 702 which are interconnected with each other. Each of the substrates may have one or more circuit components 704 formed thereon. The substrates 702 may be interconnected to form a two dimensional array, as illustrated in FIG. 7, or to form a three dimensional array, as illustrated in FIG. 8 and described further below.

Figure 7:
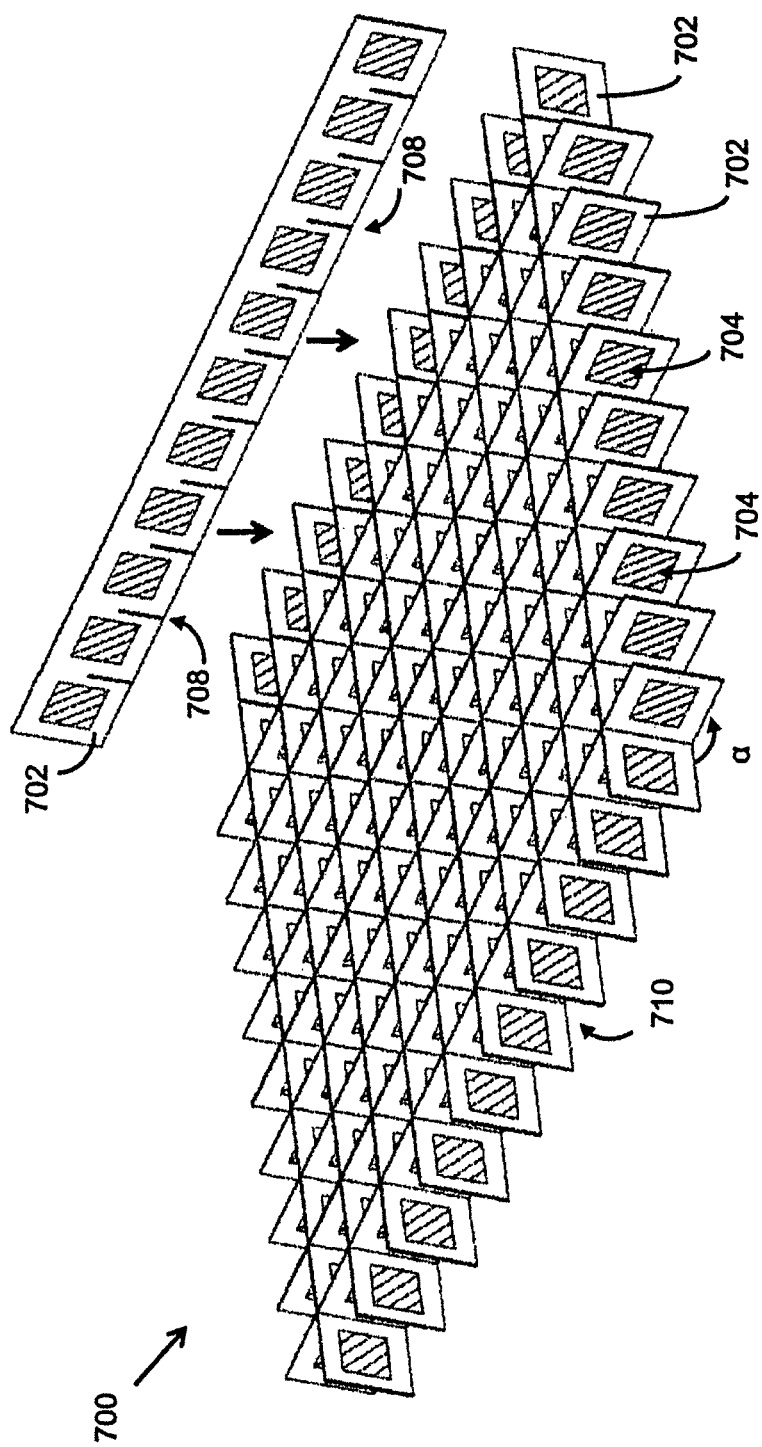
FIG. 7. illustrates a meta-material comprising a plurality of interconnected substrate strips having circuit components thereon, according to another non-limiting embodiment.
Figure 8:
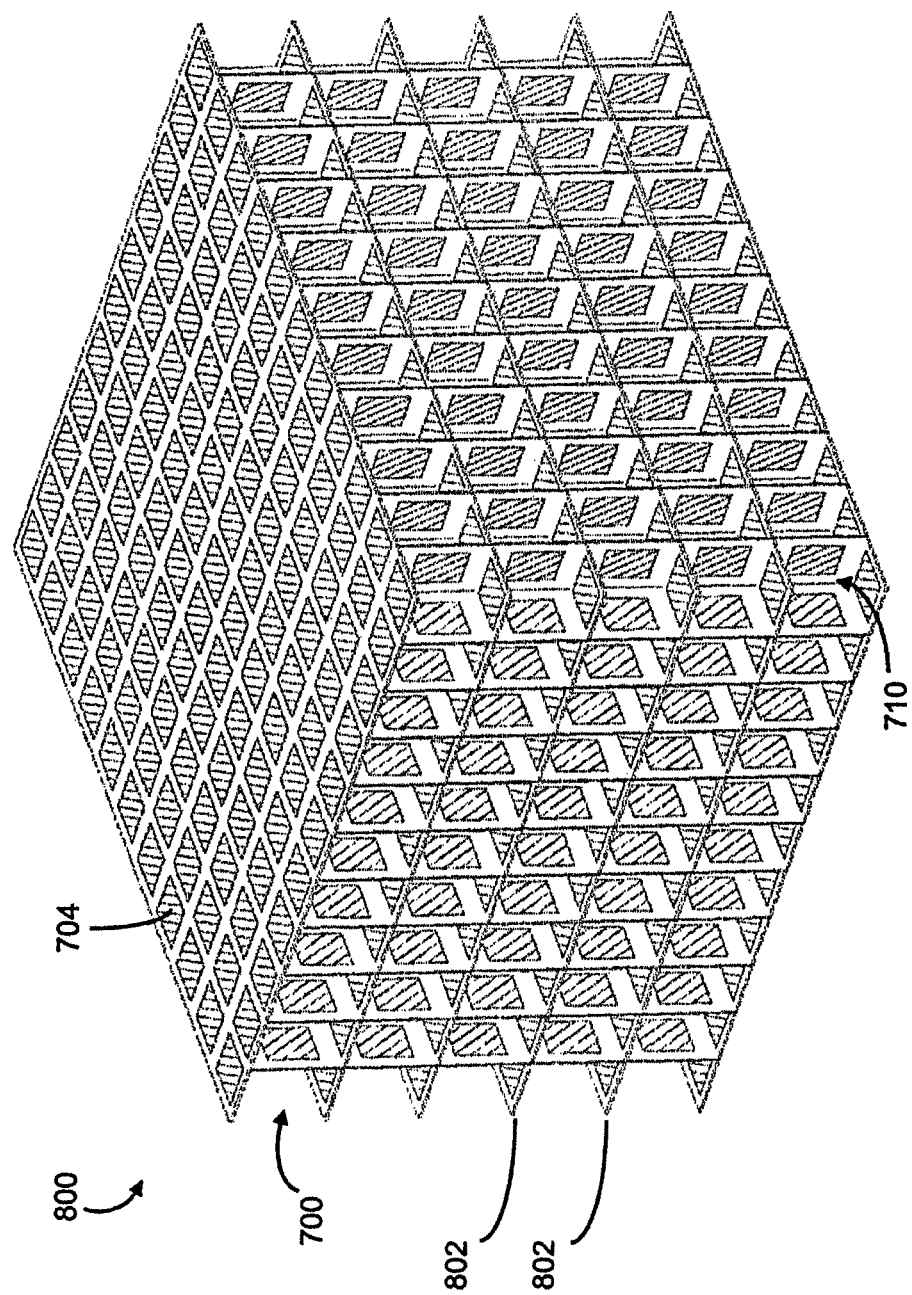
FIG. 8 illustrates an alternative configuration of a meta-material of the type shown in FIG. 7.

The substrates 702 in FIG. 7 may be any suitable substrate on which circuit components 704 may be formed. According to a non-limiting embodiment, the substrates 702 may be any of the types of substrates previously described with respect to the figures of the present application. For example, substrates 702 may be the same as previously described substrate strips 306a and 506a, though these are non-limiting examples. Thus, as a non-limiting example, each of substrates 702 may be formed of a printed circuit board having a desired dielectric constant.

The substrates 702 may be interconnected in any suitable manner. As illustrated in FIG. 7, each substrate 702 may include slits (or slots) or notches 708 which may accommodate another one of the substrates 702. For example, a substrate 702 having a slit 708 formed along a particular side of the substrate may be slid down over other substrates 702 of the electromagnetic meta-material, as illustrated by the arrows in FIG. 7. In this manner, an array of interconnected substrates may be formed. As illustrated, connection of the substrates 702 may effectively form distinct unit cells 710 in which circuit components 704 are physically separated from other circuit components of the illustrated meta-material. The angle of intersection α between the substrates may take any suitable value, and according to a non-limiting embodiment is approximately 90°. However, other angles may be used.

It should be appreciated from the foregoing that the interconnection of substrates in the manner illustrated in FIG. 7 may allow the formation of a regular, repeating pattern of circuit components 704. Thus, a desired pattern may be formed using suitable slits and substrates.

The circuit components 704 may be of any suitable type, and of any suitable number. For example, circuit components 704 may be any of those types previously described herein, for example with respect to FIGS. 1, 3, and 5. According to a non-limiting embodiment, each of circuit components 704 may comprise a split ring resonator. However, other circuit components and/or circuits may alternatively be implemented. Furthermore, each unit cell 710 need not include its own circuit component, as, for example, circuit components may only be included on a subset of the substrates 702 or only on certain portions of a substrate 702. Thus, it should be appreciated that the aspect of the present application relating to interconnection of substrates to form a grid pattern of circuit components 704 at a desired angle of intersection relative to each other is not limited to the number of circuit components, the type of circuit components, or any particular configuration of circuit components.

Optionally, interconnection of the substrates 702 may be facilitated by a fastening mechanism, for example to ensure rigidity of the interconnection and thus assist in the electromagnetic meta-material 700 maintaining a desired shape. For example, an adhesive (e.g., glue) may be placed at some or all of the intersection points of the substrates 702.

Optionally, the spaces between the substrates 702 may be filled with a filler material. As a non-limiting example, a syntactic foam may be disposed within at least some of the illustrated gaps. Not all illustrated gaps need be filled with foam, and in some embodiments, foam is not inserted in any of the gaps If a filler material is used, any suitable material may be used, such as any of those previously described herein (e.g., filler material 116 of FIG. 1).

FIG. 8 illustrates an extension of the technology illustrated in FIG. 7 to provide a three dimensional electromagnetic meta-material structure. As shown, the electromagnetic meta-material 800 includes a plurality of structures of the type illustrated in FIG. 7, i.e., a combination of a plurality of items 700. These may be stacked relative to each other, with a sheet 802 between neighboring structures 700. Each of the sheets 802 may itself optionally include a plurality of circuit components 704 of the type previously described with respect to FIG. 7, or any other suitable type of circuit component. As shown, the circuit components 704 on the sheet 802 may be arranged in any suitable manner, for example, such that a single circuit component 704 of the sheet 802 corresponds to each unit cell 710.

The sheets 802 may be formed of any suitable material, and in some embodiments may be of the same material as that used for substrates 702. For example, each of sheets 802 may comprise a printed circuit board on which the circuit component 704 may be formed in any suitable manner.

It should be appreciated that the angle which sheet 802 makes relative to the electromagnetic meta-material 700 may be any suitable angle, such as a right angle, or any other suitable angle. Accordingly, in a non-limiting embodiment, each unit cell 710 may be substantially shaped as a cube. However, other configurations are possible, as this non-limiting example is provided merely for purposes of illustration.

The sheets 802 may be bonded relative to the electromagnetic meta-material layer 700 in any suitable manner. For example, an adhesive (e.g., glue) may be used.

As with the electromagnetic meta-material 700 of FIG. 7, the unit cells 710 in FIG. 8 may be filled with a filler material, such a syntactic foam or any other suitable type of filler material. However, the use of such filler material in the configuration of FIG. 8 is optional, as not all embodiments include such a filler material.

Figure 9:
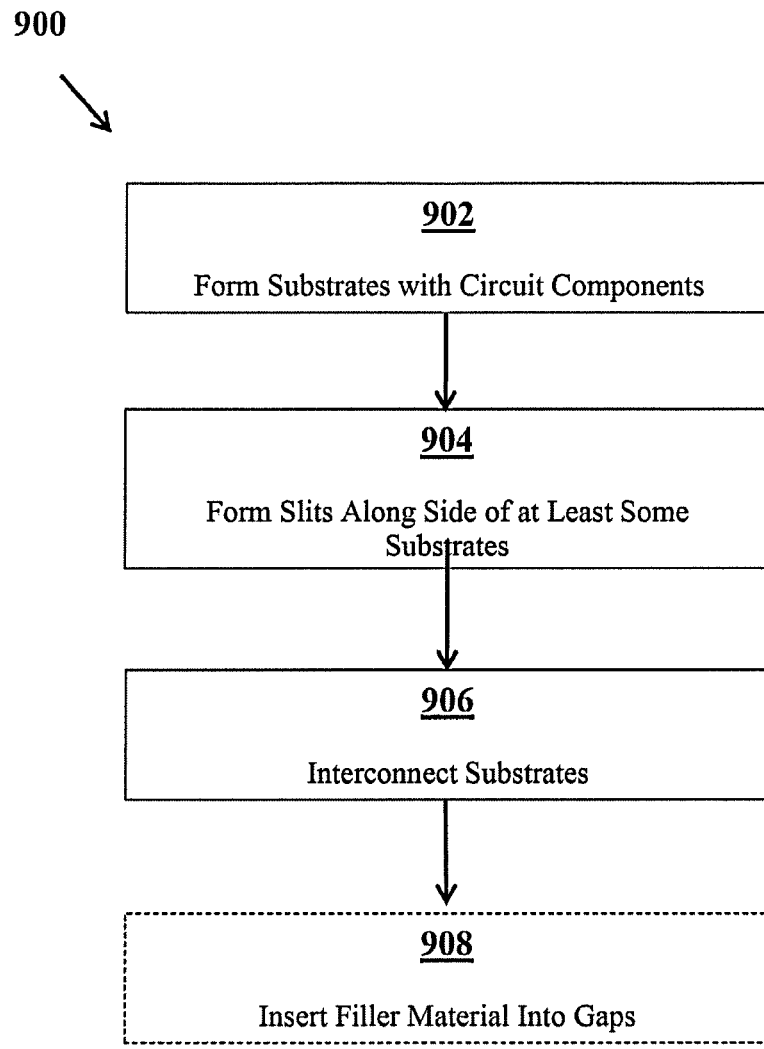
FIG. 9 is a flowchart illustrating a non-limiting process flow for making a meta-material of the type shown in FIG. 7.

FIG. 9 illustrates a method for fabricating the electromagnetic meta-material of FIG. 7. The method 900 begins at step 902 with the formation of substrates having circuit components. Step 902 may be performed in any suitable manner, including any of the manners previously described herein for forming a substrate including one or more circuit components.

At step 904, slits are made along a side of at least some substrates. In some embodiments, slits are made in all substrates, though in other embodiments slits may only be made in a subset of substrate. The slits may be made in any suitable manner.

In step 906, the substrates are interconnected. For example, one substrate having slits along its side may be slid over a plurality of other substrates, as illustrated by the arrows in FIG. 7.

Optionally, the method continues at step 908 by filling spaces between the substrates with a filler material. Any suitable filler material may be used, such as those previously described herein.

The method 900 of FIG. 9 may be extended to form a three-dimensional meta-material structure like that illustrated in FIG. 10 by adding suitable steps for connecting the structure resulting from method 900 to sheets 802.

Various benefits may be realized through use of one or more of the aspects described above. For example, one or more aspects may allow for manufacture of electromagnetic meta-materials at low cost. One or more aspects may allow for fabrication of electromagnetic meta-materials using relatively few fabrication steps. One or more aspects may allow for beneficial electromagnetic properties, for example by using materials having low dielectric constants. Thus, signal attenuation may be minimized according to one or more embodiments. It should be appreciated, however, that these are non-limiting examples of benefits which may be realized, and that additional benefits may also be realized, and likewise that not all benefits need apply to each aspect.

The electromagnetic meta-materials according to various aspects described herein may be used in various apparatus and settings. For example, the meta-materials may form at least part of an antenna, or may be used in radomes. The meta-materials may be used to focus electromagnetic signal transmission and reception, such as radar, which may allow for reduction in size of an antenna using the material, as an example. Other applications are also possible.

Having thus described several aspects of at least one embodiment of the technology, it is to be appreciated that various alterations, modifications, and improvements will readily occur to those skilled in the art. For example, the steps of the illustrated methods (e.g., the steps of FIGS. 2, 4, 6, and 9) may be rearranged in any suitable manner. Such alterations, modifications, and improvements are intended to be within the spirit and scope of the technology. Accordingly, the foregoing description and drawings provide non-limiting examples only.

What is claimed is:

1. A method of fabricating a meta-material, the method comprising:
    forming a plurality of first circuit components on a first substrate;
    forming a plurality of second circuit components on a second substrate;
    corrugating the first substrate between individual first circuit components to form a plurality of first peaks, a plurality of first troughs, and a plurality of first walls connecting the plurality of first peaks and the plurality of first troughs, wherein one of the plurality of first circuit components has all its terminals positioned on one of the plurality of first peaks, one of the plurality of first troughs or one of the plurality of first walls, and another of the plurality of first circuit components has all its terminals positioned on one of the plurality of first peaks, one of the plurality of first troughs or one of the plurality of first walls;
    corrugating the second substrate between individual second circuit components to form a plurality of second peaks, a plurality of second troughs, and a plurality of second walls connecting the plurality of second peaks and the plurality of second troughs, wherein one of the plurality of second circuit components has all its terminals positioned on one of the plurality of second peaks, one of the plurality of second troughs or one of the plurality of second walls, and another of the plurality of second circuit components has all its terminals positioned on one of the plurality of second peaks, one of the plurality of second troughs or one of the plurality of second walls; and
    positioning the first substrate relative to the second substrate to substantially align the first peaks with the second peaks and to substantially align the first troughs with the second troughs.

2. The method of claim 1, wherein positioning the first substrate relative to the second substrate includes aligning the first substrate and the second substrate to form in combination at least part of a honeycomb structure.

3. The method of claim 1, wherein forming the plurality of first circuit components on the first substrate includes forming a split ring resonator on the first substrate.

4. The method of claim 1, wherein forming the plurality of first circuit components on the first substrate includes forming a spiral loop on the first substrate.

5. The method of claim 1, further comprising forming an adhesive layer between the first substrate and the second substrate, wherein the adhesive layer is configured to maintain the first substrate and the second substrate in a fixed relation relative to each other.

6. The method of claim 5, further comprising forming a filler material between at least a portion of the first substrate and the second substrate.

7. The method of claim 6, wherein the filler material comprises a syntactic foam.

8. The method of claim 1, further comprising forming a filler material between at least a portion of the first substrate and the second substrate.

9. The method of claim 8, wherein the filler material comprises a syntactic foam.

10. The method of claim 1, further comprising forming at least one alignment hole in the first substrate and at least one alignment hole in the second substrate.

11. The method of claim 10, wherein forming the at least one alignment hole in the first substrate and the at least one alignment hole in the second substrate is performed prior to positioning the first substrate relative to the second substrate.

12. The method of claim 1, wherein corrugating the first substrate includes corrugating the first substrate to include at least one of the plurality of first circuit components on one of the plurality of first peaks.

13. The method of claim 1, wherein corrugating the first substrate includes corrugating the first substrate to include at least one of the plurality of first circuit components on one of the plurality of first troughs.

14. The method of claim 1, wherein corrugating the first substrate includes corrugating the first substrate to include at least one of the plurality of first circuit components on one of the plurality of first walls.

15. The method of claim 1, wherein forming the plurality of first circuit components on the first substrate further comprises printing the plurality of first circuit components on the first substrate.

* * * * *